United States Patent
Shimizu et al.

(10) Patent No.: US 11,485,137 B2
(45) Date of Patent: Nov. 1, 2022

(54) PIEZOELECTRIC DEVICE, LIQUID EJECTING HEAD, AND LIQUID EJECTING APPARATUS

(71) Applicant: Seiko Epson Corporation, Tokyo (JP)

(72) Inventors: Toshihiro Shimizu, Fujimi (JP); Koji Sumi, Shiojiri (JP)

(73) Assignee: SEIKO EPSON CORPORATION

( * ) Notice: Subject to any disclaimer, the term of this patent is extended or adjusted under 35 U.S.C. 154(b) by 0 days.

(21) Appl. No.: 17/104,117

(22) Filed: Nov. 25, 2020

(65) Prior Publication Data

US 2021/0162761 A1  Jun. 3, 2021

(30) Foreign Application Priority Data

Nov. 29, 2019 (JP) .............................. JP2019-216451

(51) Int. Cl.
  *B41J 2/14* (2006.01)
  *H01L 41/09* (2006.01)
(52) U.S. Cl.
  CPC ...... *B41J 2/14233* (2013.01); *H01L 41/0973* (2013.01)

(58) Field of Classification Search
  None
  See application file for complete search history.

(56) References Cited

U.S. PATENT DOCUMENTS

| | | | |
|---|---|---|---|
| 2011/0075867 A1* | 3/2011 | Chung | H04R 17/00 381/190 |
| 2012/0268529 A1* | 10/2012 | Baumer | B41J 2/03 347/54 |
| 2018/0154652 A1* | 6/2018 | Yazaki | B41J 2/055 |
| 2018/0170052 A1 | 6/2018 | Menzel et al. | |

FOREIGN PATENT DOCUMENTS

WO  2018-118774 A1  6/2018

* cited by examiner

*Primary Examiner* — Erica S Lin
(74) *Attorney, Agent, or Firm* — Harness, Dickey & Pierce, P.L.C.

(57) ABSTRACT

A piezoelectric device including a flow path forming substrate in which pressure chambers are formed, a diaphragm, and piezoelectric actuators. Active portions, each having a piezoelectric layer interposed between a first electrode and a second electrode, are each, in plan view, provided from an edge portion opposing the pressure chamber to a portion outside the pressure chamber, and a ratio of a film thickness of the piezoelectric layer to a film thickness of the diaphragm is 4.7 or less.

9 Claims, 15 Drawing Sheets

Al₂O₃

FIG. 14
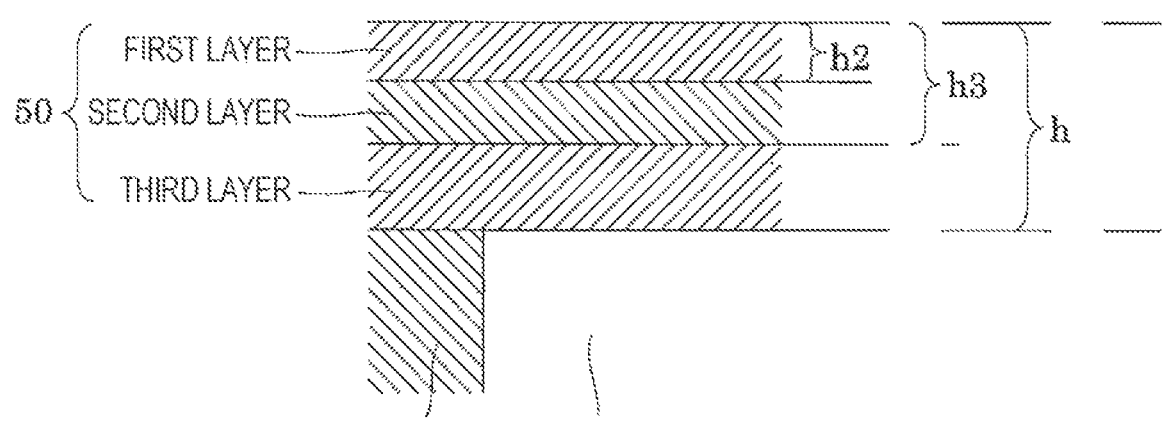
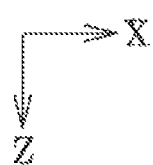

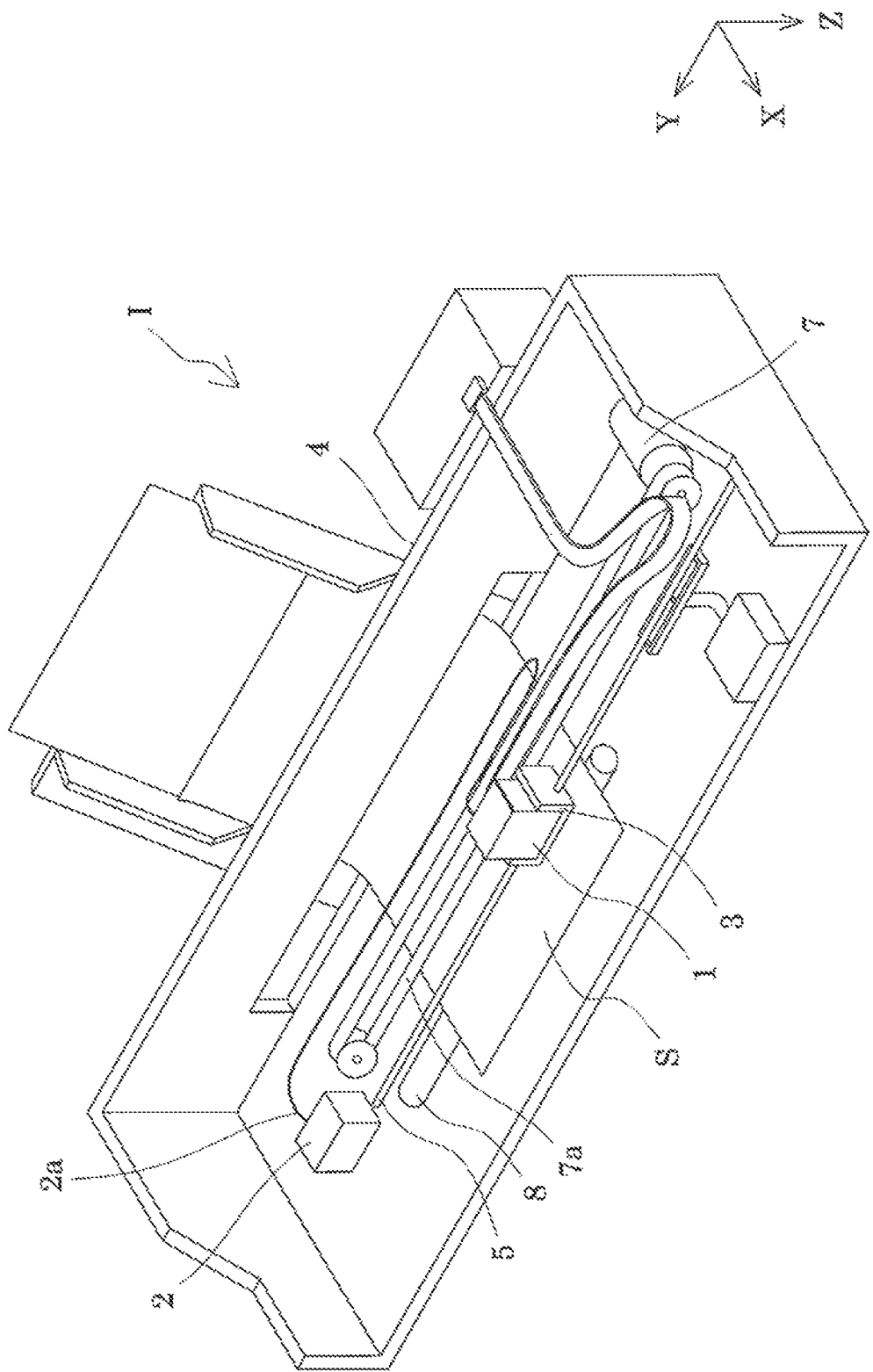

PIEZOELECTRIC DEVICE, LIQUID EJECTING HEAD, AND LIQUID EJECTING APPARATUS

The present application is based on, and claims priority from JP Application Serial Number 2019-216451, filed Nov. 29, 2019, the disclosure of which is hereby incorporated by reference herein in its entirety.

BACKGROUND

1. Technical Field

The present disclosure relates to a piezoelectric device, a liquid ejecting head including the piezoelectric device, and a liquid ejecting apparatus including the liquid ejecting head.

2. Related Art

As an example of a liquid ejecting head including a piezoelectric device, there is a liquid ejecting head that includes a substrate in which pressure chambers are formed, and piezoelectric actuators provided on a surface of the substrate on one side with a diaphragm in between. As an example of the piezoelectric actuator, there is a known piezoelectric actuator in which a first electrode, a piezoelectric layer, and a second electrode are layered from the diaphragm side and in which the diaphragm is flexed and deformed with the active portion which is where the piezoelectric layer is interposed between the first electrode and the second electrode.

As a form of such a piezoelectric actuator, there is a known piezoelectric actuator in which an annular-shaped active portion is provided from an inner side to an outer side with respect to a wall constituting a pressure chamber (see International Publication WO 2018/118774, for example). The active portion has a so-called cantilever structure in which a portion disposed on the outer side of the wall of the pressure chamber is a fixed end, and a portion disposed on the inner side of the wall of the pressure chamber is the free end. Such a piezoelectric actuator deforms and protrudes the diaphragm towards a side opposite the pressure chamber when a voltage is applied thereto.

When a length of a portion (hereinafter, referred to as a free end portion) of the active portion in the piezoelectric actuator that is disposed from the wall of the pressure chamber to the inside of the pressure chamber is referred to as a bulging length, the displacement of the diaphragm becomes larger as the bulging length becomes larger.

When the bulging length of the free end portion is provided in an ample manner, the width of the pressure chamber needs to be increased in accordance with the bulging length. However, if the resolution of the liquid ejecting head is to be set to a desired resolution, in other words, if the densities of the nozzles that eject a liquid and the pressure chambers that are in communication with the nozzles are to be at desired densities, it will be difficult for one to increase the sizes of the pressure chambers.

As described above, in known liquid ejecting heads, it is difficult to improve the displacement of the diaphragm that applies pressure and deforms the pressure chambers and to suppress the increase in the sizes of the pressure chambers at the same time.

Note that such an issue is not limited to liquid ejecting heads, the representative example being an ink jet recording head, and exists in a similar manner in other piezoelectric devices.

SUMMARY

In view of the above circumstance, an object of the present disclosure is to provide a piezoelectric device, a liquid ejecting head, and a liquid ejecting apparatus that are capable of suppressing an increase in the size of the recessed portions formed in the substrate and to which pressure from the diaphragm is applied, and that are capable of improving the displacement of the diaphragm.

An aspect of the present disclosure overcoming the issue described above is a piezoelectric device including a substrate in which a plurality of recessed portions are formed, a diaphragm formed on a surface of the substrate on one side and a piezoelectric actuator formed on a surface of the diaphragm on a side opposite the substrate, the piezoelectric actuator including a first electrode, a piezoelectric layer, and a second electrode. In the piezoelectric device, the piezoelectric actuator includes an active portion in which the piezoelectric layer is interposed between the first electrode and the second electrode, in plan view viewed in a direction in which the first electrode, the piezoelectric layer, and the second electrode are layered, the active portion is provided from an edge portion to a portion outside a recessed portion of the plurality of recessed portions, the edge portion being, in an area that opposes the recessed portion, an area other than a middle portion, and in an area where the active portion and the diaphragm overlap each other in plan view, a ratio $t_f/t_s$ of a film thickness $t_f$ of the piezoelectric layer to a film thickness $t_s$ of the diaphragm is 4.7 or less.

Furthermore, another aspect of the present disclosure is a liquid ejecting head that includes the piezoelectric device according to the above aspect.

Moreover, another aspect of the present disclosure is a liquid ejecting apparatus that includes the liquid ejecting head according to the above aspect.

BRIEF DESCRIPTION OF THE DRAWINGS

FIG. 14 is a cross-sectional view of a diaphragm formed of a plurality of layers.

FIG. 16 is a diagram illustrating a schematic configuration of a recording apparatus according to an exemplary embodiment.

DESCRIPTION OF EXEMPLARY EMBODIMENTS

Figure 1:
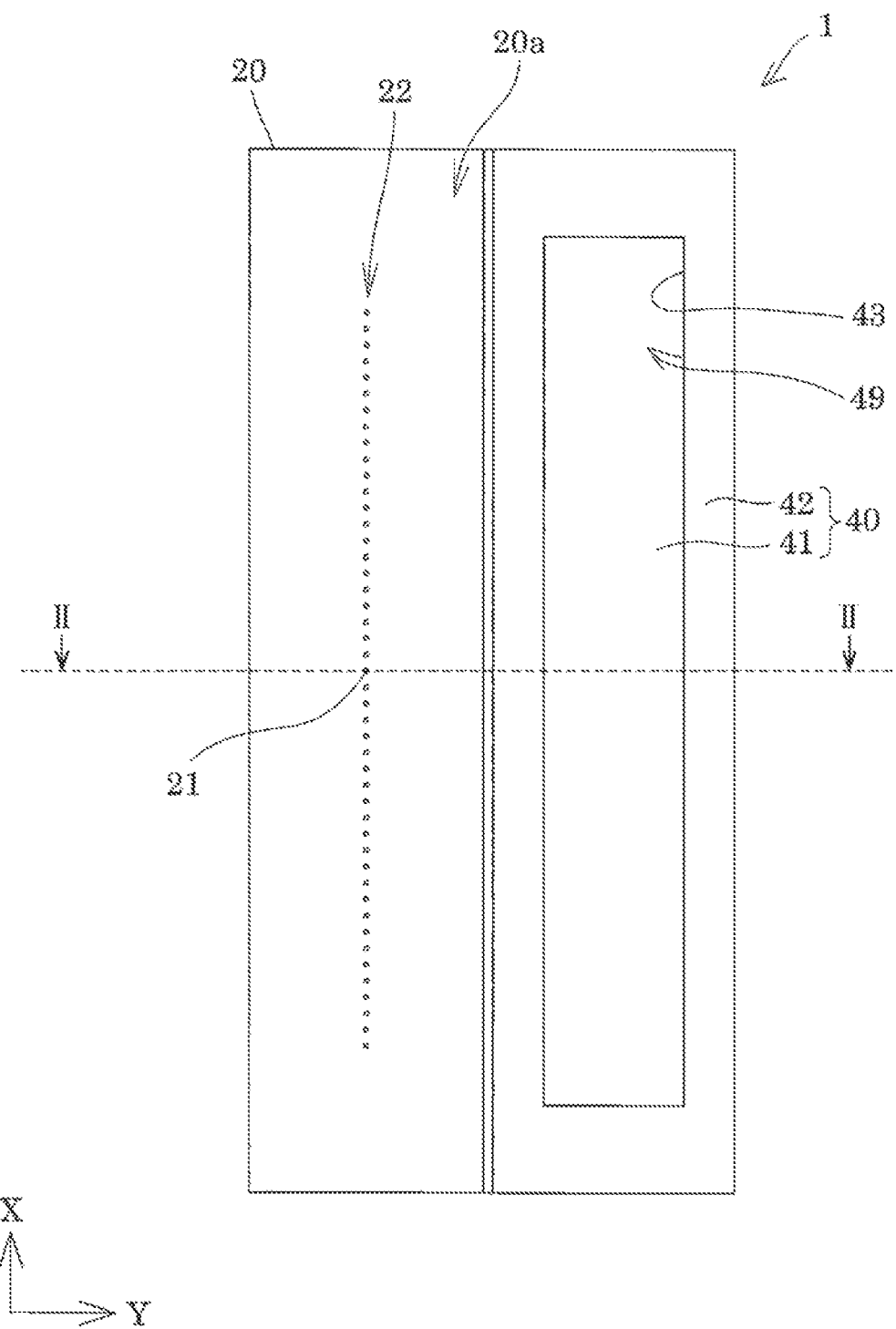
FIG. 1 is a plan view of a recording head according to a first exemplary embodiment.

The present disclosure will be described in detail with reference to the exemplary embodiments. Note that the description hereinafter illustrates an aspect of the present disclosure and may be modified in any way within the scope of the present disclosure. In the drawings, members attached with the same reference numeral depict the same member and description thereof is appropriately omitted. Furthermore, X, Y, and Z in the drawings indicate three spatial axes that are orthogonal to each other. In the present specification, directions extending along the above axes are an X direction, a Y direction, and a Z direction. The description will be given while a direction towards which each arrow extends is a positive (+) direction, and a direction opposite the direction towards which the arrow extends is a negative (−) direction. Furthermore, the Z direction indicates a vertical direction in which a +Z direction extends vertically downwards and a −Z direction extends vertically upwards.

First Exemplary Embodiment

Figure 2:
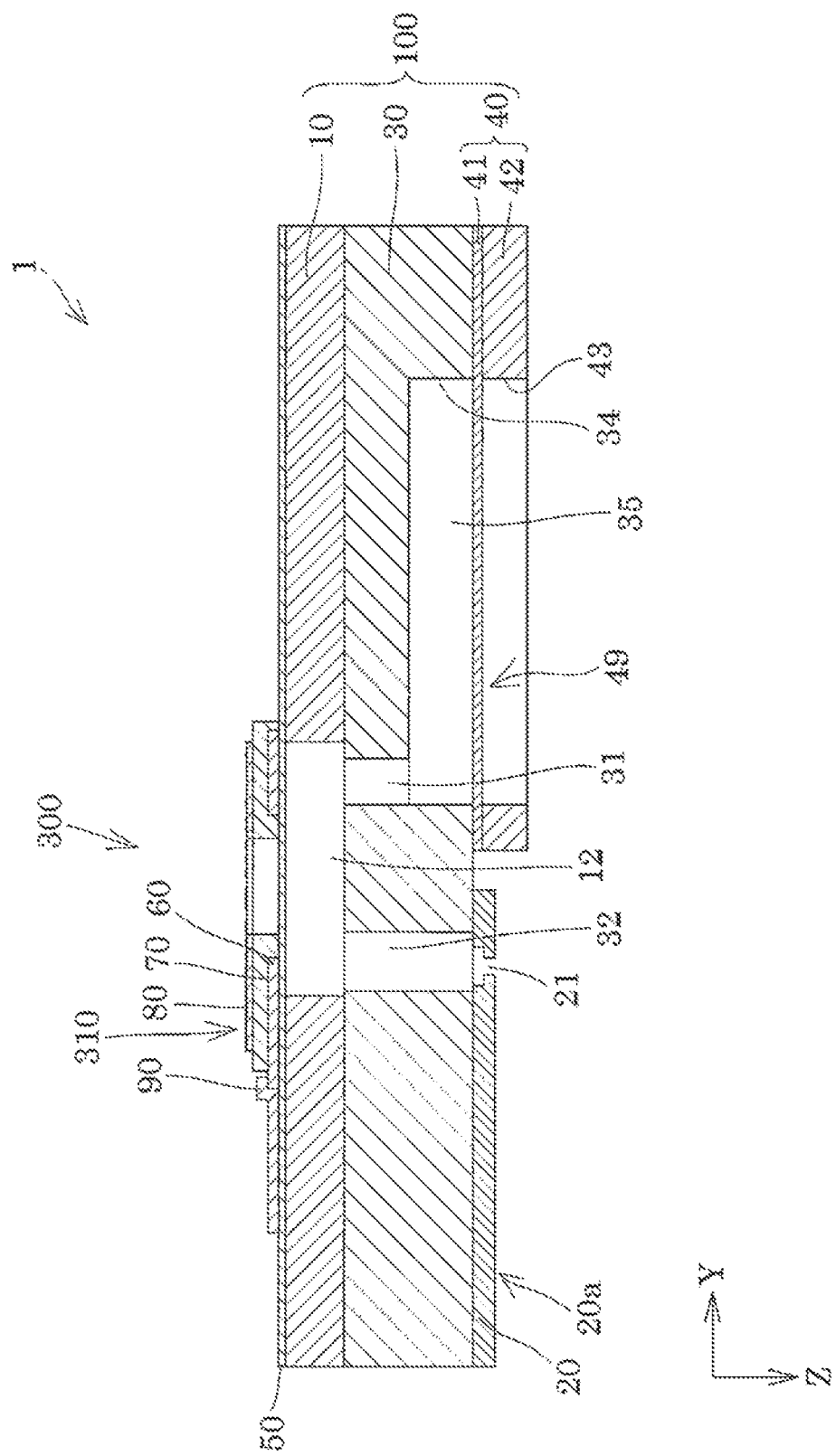
FIG. 2 is a cross-sectional view of the recording head according to the first exemplary embodiment.
Figure 3:
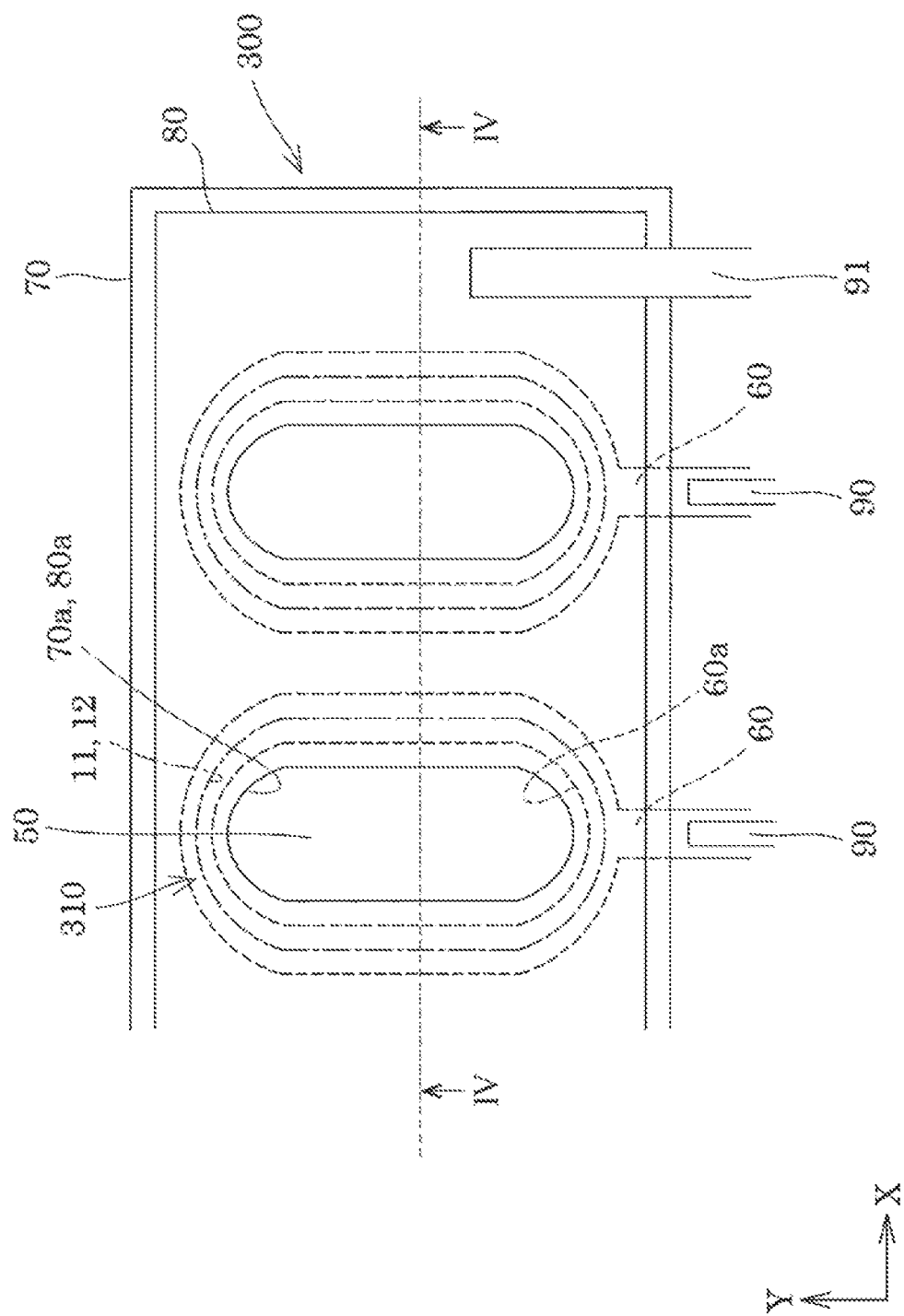
FIG. 3 is a plan view of an essential portion of a piezoelectric actuator according to the first exemplary embodiment.
Figure 4:
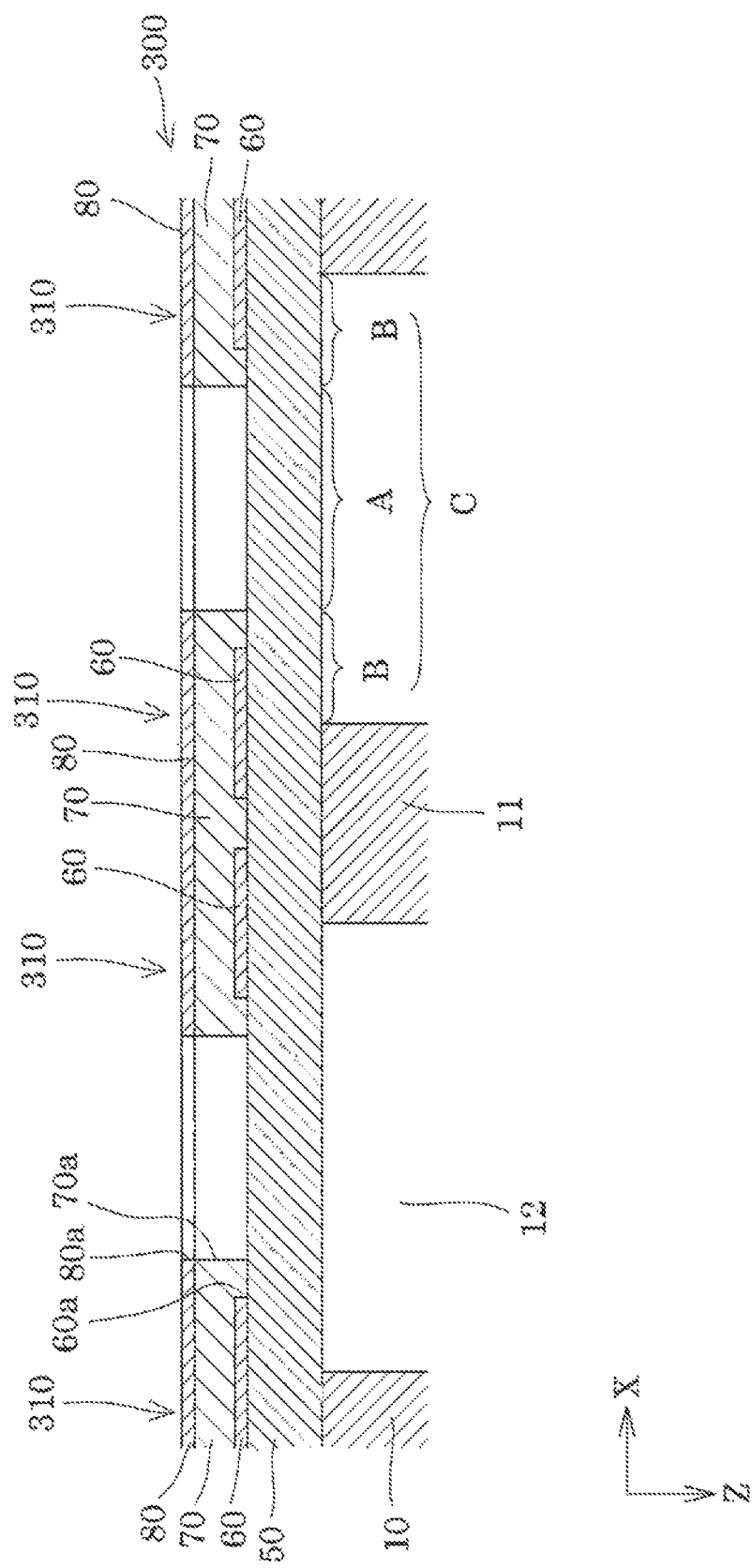
FIG. 4 is a cross-sectional view of an essential portion of the piezoelectric actuator according to the first exemplary embodiment.

Referring to FIGS. 1 to 4, a description of an ink jet recording head (hereinafter, referred to as a recording head) that is an example of the liquid ejecting head will be given. FIG. 1 is a plan view of the recording head viewed from a nozzle surface side of the recording head. FIG. 2 is a cross-sectional view taken along line II-II in FIG. 1. FIG. 3 is a plan view in which an essential portion of the piezoelectric actuator provided in the recording head has been enlarged. FIG. 4 is a cross-sectional view taken along line IV-IV in FIG. 3.

A recording head 1 includes a flow path unit 100, a diaphragm 50, and piezoelectric actuators 300. In the flow path unit 100 of the present exemplary embodiment, a flow path forming substrate 10, a common liquid chamber substrate 30, a nozzle plate 20, and a compliance substrate 40 are joined to each other.

The diaphragm 50 is formed on a −Z side of the flow path forming substrate 10. The diaphragm 50 of the present exemplary embodiment contains single crystal silicon. Specifically, the diaphragm 50 is formed by layering, from a pressure chamber 12 side towards a piezoelectric actuator 300 side, a plurality of films such as a film (not shown) formed of single crystal silicon, an elastic film (not shown) formed of silicon oxide, and an insulating film (not shown) formed of zirconium oxide.

Areas in the diaphragm 50 configured in the above manner that oppose pressure chambers 12 is referred to as movable areas C. Furthermore, in plan view, an area in each movable area C that is inside an end portion (a partition wall 11) of the corresponding pressure chamber 12 and that does not include the middle of the pressure chamber 12 is referred to as an edge portion B. Furthermore, an area in each movable area C other than the edge portion B is referred to as a middle portion A.

The flow path forming substrate 10 is formed of silicon single crystal substrate and is a substrate in which the pressure chambers 12 are formed. Specifically, the plurality of pressure chambers 12 are provided in the flow path forming substrate 10 so as to be separated from each other with the plurality of partition walls 11.

The plurality of pressure chambers 12 are provided side-by-side at predetermined pitches along the X direction in which the plurality of nozzles 21 that discharge ink are provided side-by-side. A single row of pressure chambers 12 provided side-by-side in the X direction is provided in the present exemplary embodiment. Furthermore, the flow path forming substrate 10 is disposed so that in-plane directions thereof include the X direction and the Y direction. It goes without saying that the disposition of the pressure chambers 12 is not particularly limited to the above and, for example, may be a so-called staggered arrangement in which, in the pressure chambers 12 arranged in a parallel manner in the X direction, the pressure chambers 12 are alternately disposed at positions shifted in the Y direction. Alternatively, the disposition of the pressure chambers 12 may be a so-called matrix arrangement in which a plurality of pressure chambers 12 are arranged at predetermined intervals in the X direction and the Y direction.

The pressure chamber 12 of the present exemplary embodiment has a substantially elliptical shape that is shaped (see FIG. 3) so that the major axis thereof extends in the Y direction in plan view viewed in a layered direction (the Z direction) of a first electrode 60, a piezoelectric layer 70, and a second electrode 80. As illustrated in FIG. 2, a first flow path 31 and a second flow path 32 are coupled to two end sides of the pressure chamber 12 in a longitudinal direction. Note that the shape of the pressure chamber 12 is not particularly limited to the above shape and, for example, may be a square shape, a rectangular shape, a polygonal shape, a parallelogram shape, a circular shape, or a long hole shape. Note that a long hole shape is an oval shape or a shape similar to an oval shape such as, for example, a rounded rectangular shape, an egg shape, or an elliptical shape.

Such a pressure chamber 12 is formed by performing anisotropic etching on the flow path forming substrate 10 from the surface side to which the nozzle plate 20 is joined, and a surface of the pressure chamber 12 on a side opposite the nozzle plate 20 is defined by the diaphragm 50.

The common liquid chamber substrate 30 is a substrate in which a common liquid chamber 35 in communication with each of the pressure chambers 12 is formed. The common liquid chamber substrate 30 is provided on the +Z side of the flow path forming substrate 10. The common liquid chamber substrate 30 can be manufactured of metal such as stainless steel, glass, a ceramic material, and the like. Desirably, a material that has a coefficient of thermal expansion that is the same as that of the flow path forming substrate 10 is used in the common liquid chamber substrate 30 and, in the present exemplary embodiment, a silicon single crystal substrate that is the same as that of the flow path forming substrate 10 is used to form the common liquid chamber substrate 30.

A liquid chamber forming recessed portion 34 open towards the +Z side is formed in the common liquid chamber substrate 30. On a surface of the common liquid chamber substrate 30 on the +Z side, the compliance substrate 40 including a compliance portion 49 seals the opening of the liquid chamber forming recessed portion 34 on the +Z side. The compliance substrate 40 sealing the liquid chamber forming recessed portion 34 forms the common liquid chamber 35 in the common liquid chamber substrate 30.

In the present exemplary embodiment, such a compliance substrate 40 includes a sealing film 41 formed of a thin flexible film, and a fixing substrate 42 formed of a hard material such as metal. An area of the fixing substrate 42 opposing the common liquid chamber 35 is a penetration 43 completely removed in the thickness direction; accordingly, a portion of a wall surface of the common liquid chamber 35 is the compliance portion 49, which is a flexible portion sealed by the flexible sealing film 41 alone. As described above, by providing the compliance portion 49 in a portion of the wall surface of the common liquid chamber 35, the pressure change in the ink inside the common liquid chamber 35 can be absorbed by deformation of the compliance portion 49.

Furthermore, the first flow path 31 is provided in a plural number. The plurality of first flow paths 31 that are each in communication with the corresponding pressure chamber 12 are formed in the common liquid chamber substrate 30. Each first flow path 31 is a flow path that couples the corresponding pressure chamber 12 and the common liquid chamber 35 to each other and is provided so as to penetrate through the common liquid chamber substrate 30 in the Z direction. Each first flow path 31 is in communication with the common liquid chamber 35 at an end portion thereof in the +Z direction and is in communication with the corresponding pressure chamber 12 in end portion thereof in the −Z direction.

Furthermore, the second flow path 32 is provided in a plural number. The plurality of second flow paths 32 that communicate the pressure chambers 12 and the nozzles 21 to each other are formed in the common liquid chamber substrate 30. Each second flow path 32 is a flow path that couples the corresponding pressure chamber 12 and the corresponding nozzle 21 to each other and is provided so as to penetrate through the common liquid chamber substrate 30 in the Z direction. Each second flow path 32 is in communication with the corresponding nozzle 21 at an end portion thereof in the +Z direction and is in communication with the corresponding pressure chamber 12 at an end portion thereof in the −Z direction.

The nozzle plate 20 is provided on the +Z side of the common liquid chamber substrate 30. The plurality of nozzles 21 that eject the ink in the +Z direction are formed in the nozzle plate 20. As illustrated in FIG. 1, in the present exemplary embodiment, a single nozzle row 22 is formed by disposing the plurality of nozzles 21 on a straight line extending in the X direction. The nozzle plate 20 can be formed of a flat plate material formed of metal such as stainless steel (SUS), an organic matter such as polyimide resin, or silicon. It goes without saying that the disposition of the nozzles 21 is not particularly limited to the above and, for example, may be a so-called staggered arrangement in which, in the nozzles 21 arranged in a parallel manner in the X direction, the nozzles 21 are alternately disposed at positions shifted in the Y direction. Alternatively, the disposition of the nozzles 21 may be a so-called matrix arrangement in which a plurality of nozzles 21 are arranged at predetermined intervals in the X direction and the Y direction.

Ink flow paths from the common liquid chamber 35 to the nozzles 21 passing through the first flow paths 31, the pressure chambers 12, and the second flow paths 32 are formed in the flow path unit 100 configured in the above manner. While not particularly illustrated in the drawings, the common liquid chamber 35 is configured to have ink supplied thereto from an external ink supplying member. The ink supplied from the external ink supplying member is supplied to the common liquid chamber 35. Furthermore, the ink is supplied from the common liquid chamber 35 to the pressure chambers 12 through the first flow paths 31. The ink in the pressure chambers 12 passes through the second flow paths 32 and is ejected through the nozzles 21 with the piezoelectric actuators 300 described later.

The first electrode 60, the piezoelectric layer 70, and the second electrode 80 layered on a side of the diaphragm 50, which is formed on the flow path forming substrate 10, opposite the flow path forming substrate 10 by a film forming and lithographic method constitute the piezoelectric actuator 300.

One of the electrodes of the piezoelectric actuator 300 is configured as a common electrode. The other electrode and the piezoelectric layer 70 are formed for each pressure chamber 12 by patterning. In the present exemplary embodiment, the first electrodes 60 are individual electrodes of the piezoelectric actuators 300, and the second electrode 80 is the common electrode of the piezoelectric actuators 300.

In the piezoelectric actuator 300, a portion where the piezoelectric layer 70 is interposed between the first electrode 60 and the second electrode 80 is referred to as an active portion 310. The active portion 310 is provided for each pressure chamber 12.

The active portion 310 is provided from the edge portion B of the movable area C (see FIG. 4) of the diaphragm 50 to a portion outside the pressure chamber 12. As illustrated in FIG. 3, a shape of such each active portion 310 in plan view is similar to that of the pressure chamber 12, which is a substantially elliptical shape in which the Y direction is the longitudinal direction.

The first electrode 60 in plan view has an annular shape and is formed for each of the plurality of active portions 310. In other words, similar to the pressure chamber 12, the first electrode 60 has a substantially elliptical outer circumferential shape in which the major axis extends in the Y direction. An opening portion 60a having a similar shape as the outer circumferential shape is formed in the middle portion of the first electrode 60. Furthermore, the first electrode 60 is formed so as to overlap the partition wall 11. In other words, the opening portion 60a of the first electrode 60 is positioned inside the partition wall 11, and the outer circumference of the first electrode 60 is positioned outside the partition wall (on the side opposite the pressure chamber 12). Note that the first electrode 60 is configured of an electrically conducting material such as, for example, gold, silver, copper, palladium, palladium, or titanium.

The piezoelectric layer 70 common to each of the active portions 310 is formed so as to cover each of the first electrodes 60. First through holes 70a that penetrate through the piezoelectric layer 70 in the thickness direction are formed in the piezoelectric layer 70. In plan view (see FIG. 3), each first through hole 70a is positioned inside the opening portion 60a of the corresponding first electrode 60 and has an opening having a shape that is similar to that of the opening portion 60a.

Such a piezoelectric layer 70 can be configured of a ferroelectric piezoelectric material or a ceramic material such as, for example, lead zirconate titanate (PZT). The piezoelectric layer 70 described above can be obtained by forming a layer of such a piezoelectric material covering the first electrodes 60 and by forming the first through holes 70a by etching. It goes without saying that the piezoelectric layer 70 does not have to be provided common to the first electrodes 60 and may be formed for each of the first electrodes 60.

The second electrode 80 common to each of the active portions 310 is formed on the piezoelectric layer 70. Furthermore, second through holes 80a that penetrate through the second electrode 80 is formed in the second electrode 80. The second through hole 80a has a shape that is substantially the same as that of the first through hole 70a and is disposed so as to overlap the first through hole 70a. Note that the second electrode 80 is configured of an electrically conducting material such as, for example, gold, silver, copper, palladium, palladium, or titanium.

Each first electrode 60 is drawn out to the outside of the piezoelectric layer 70 in the Y direction. A first lead electrode 90 is coupled to the first electrode 60. A second lead electrode 91 is coupled to the second electrode 80. In the Y direction, the second lead electrode 91 is drawn out to a direction that is the same as that of the first lead electrode 90.

The first lead electrode 90 is coupled to the first electrode 60 of each piezoelectric actuator 300. A voltage is selectively applied to each piezoelectric actuator 300 through the corresponding first lead electrode 90. Furthermore, the second lead electrode 91 is coupled to the second electrode 80, which is common to the piezoelectric actuators 300. A bias voltage is applied to the second electrode 80 through the second lead electrode 91.

In such a recording head 1, when a voltage is applied to the first electrode 60 and the second electrode 80 of each piezoelectric actuator 300, the corresponding active portion 310 becomes flexed and deformed. The flexing and the deformation of the active portions 310 deform the diaphragm 50, which applies pressure to the ink inside the pressure chambers 12 and ejects the ink through the nozzles 21. Note that the piezoelectric actuator 300 is configured so that the active portion 310 is provided in the edge portion B of the diaphragm 50, and the active portion 310 is not provided in the middle portion A. In the piezoelectric actuator 300 configured in such a manner, the displacement of the diaphragm 50 is improved and the amount of ejected ink is increased when compared with a configuration in which the active portion 310 is provided in the middle portion A.

Figure 5:
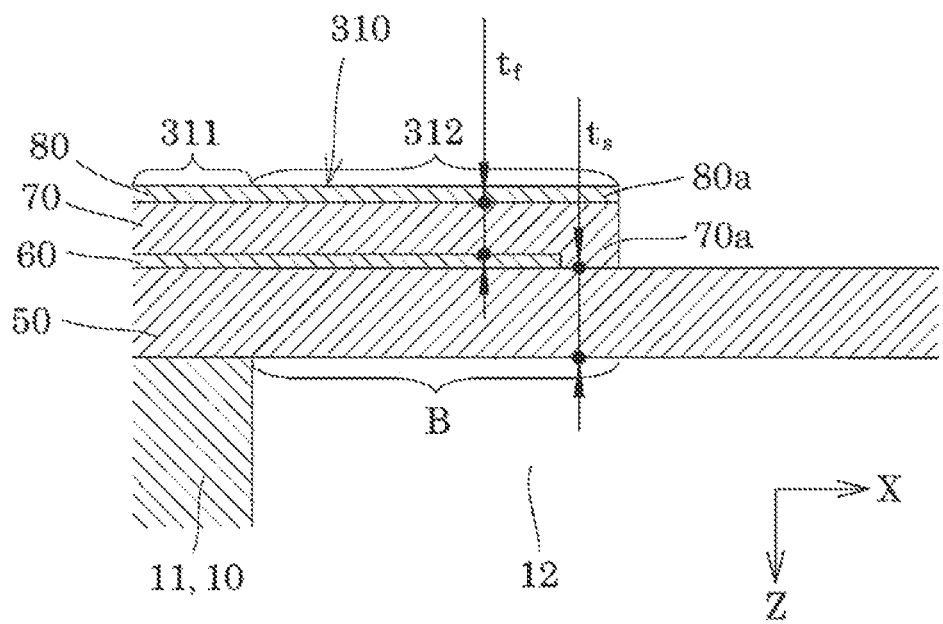
FIG. 5 is a cross-sectional view of an essential portion of the piezoelectric actuator according to the first exemplary embodiment.
Figure 6:
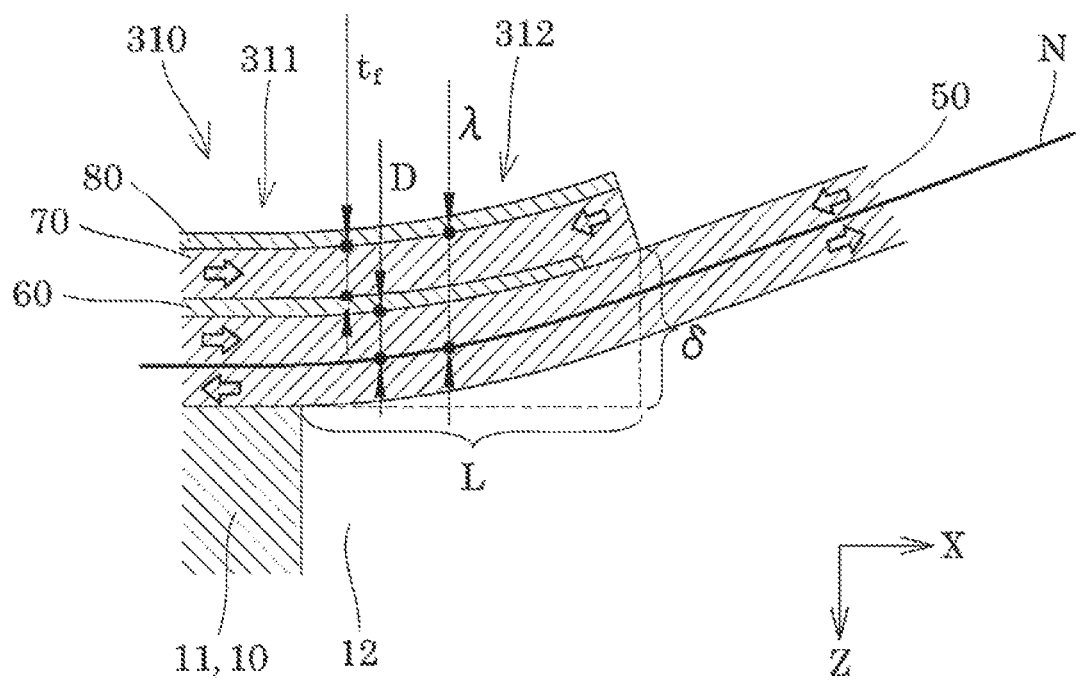
FIG. 6 is a cross-sectional view of the essential portion of the piezoelectric actuator according to the first exemplary embodiment.

Referring now to FIGS. 5 and 6, the diaphragm 50 and the active portion 310 will be described in detail. FIGS. 5 and 6 are cross-sectional views in which essential portions of a cross section taken along line IV-IV in FIG. 3 have been enlarged. FIG. 5 illustrates a state in which a voltage is not applied to the active portion 310, and FIG. 6 illustrates a state in which a voltage is applied to the active portion 310.

As described above, the active portion 310 has an annular shape and is provided from the edge portion B to a portion outside the pressure chamber 12. In plan view viewed in the Z direction, a portion of the active portion 310 outside the partition wall 11 of the pressure chamber 12 (on a side opposite the pressure chamber 12) is a fixed end portion 311 that is fixed to the partition wall 11 with the diaphragm 50 in between. Furthermore, in plan view viewed in the Z direction, a portion of the active portion 310 inside the partition wall of the pressure chamber 12 (on a side of the pressure chamber 12) is a free end portion 312 that opposes the pressure chamber 12 and that is not fixed to the partition wall 11.

Note that the free end portion 312 of the present exemplary embodiment includes a non-active portion that is continuous to the active portion 310 and that opposes the pressure chamber 12. The non-active portion herein is a portion in which either one of the first electrode 60 and the second electrode 80 and the piezoelectric layer 70 are layered, or is a portion configured of only the piezoelectric layer 70. In the example in FIG. 5, the non-active portion in which an end portion of the piezoelectric layer 70 on the first through hole 70a side and an end portion of the second electrode 80 on the second through hole 80a side are layered is included in the free end portion 312.

When in plan view viewed in the Z direction, a film thickness of the diaphragm 50 in the area in which the active portion 310 and the diaphragm 50 overlap each other is referred to as $t_s$, and a film thickness of the piezoelectric layer 70 in the above area is referred to as $t_f$. A length of the free end portion 312 is referred to as a bulging length L. A displacement of a distal end portion of the free end portion 312 in the Z direction is referred to as $\delta$. A reference of the displacement $\delta$ is a flat state in which a voltage is not applied to the active portion 310 (see FIG. 5). The displacement $\delta$ is the displacement of the distal end portion in the Z direction when a voltage is applied to the active portion 310 (see FIG. 6).

The displacement $\delta$ of the free end portion 312 is given by the following equations.

$$\delta = K\delta \cdot 3 d_{31} L^2 V, \text{ and} \qquad \text{Equation 1}$$

$$K\delta = \{1+(t_f/t_s)\}/t_s^2 \{(E_f/E_s)\cdot(t_f/t_s)^4 + 4(t_f/t_s)^3 + 6(t_f/t_s)^2 + 4(t_f/t_s)+(E_s/E_f)\}, \text{ where} \qquad \text{Equation 2}$$

$d_{31}$ is a piezoelectric constant, V is an applied voltage, $E_f$ is a Young's modulus of the piezoelectric layer, and $E_s$ is a Young's modulus of the diaphragm.

Note that when, compared with the film thickness of the single crystal silicon contained in the diaphragm 50, the film thicknesses of the first electrode 60 and the second electrode 80 are negligibly small, a representative example of the film thickness and the Young's modulus of the diaphragm 50 can be the film thickness and the Young's modulus of the single crystal silicon. Accordingly, the film thickness $t_s$ of the diaphragm 50 is represented by the thickness of the film of the single crystal silicon contained in the diaphragm 50, and the Young's modulus $E_s$ of the diaphragm 50 is represented by the Young's modulus of the single crystal silicon.

As expressed by Equation 1, if the bulging length L, the piezoelectric constant $d_{31}$, and the applied voltage V are fixed, the displacement $\delta$ becomes larger as the K$\delta$ becomes larger. As expressed by Equation 2, K$\delta$ is a coefficient determined by the Young's modulus $E_f$ and the film thickness $t_f$ of the piezoelectric layer 70, and the Young's modulus $E_s$ of the diaphragm 50. Since the Young's moduli are determined by the materials of the diaphragm 50 and the piezoelectric layer 70, the displacement $\delta$ of the free end portion 312 is a variable obtained by a ratio $t_f/t_s$ of the piezoelectric layer 70 to the film thicknesses of the diaphragm 50.

Figure 7:
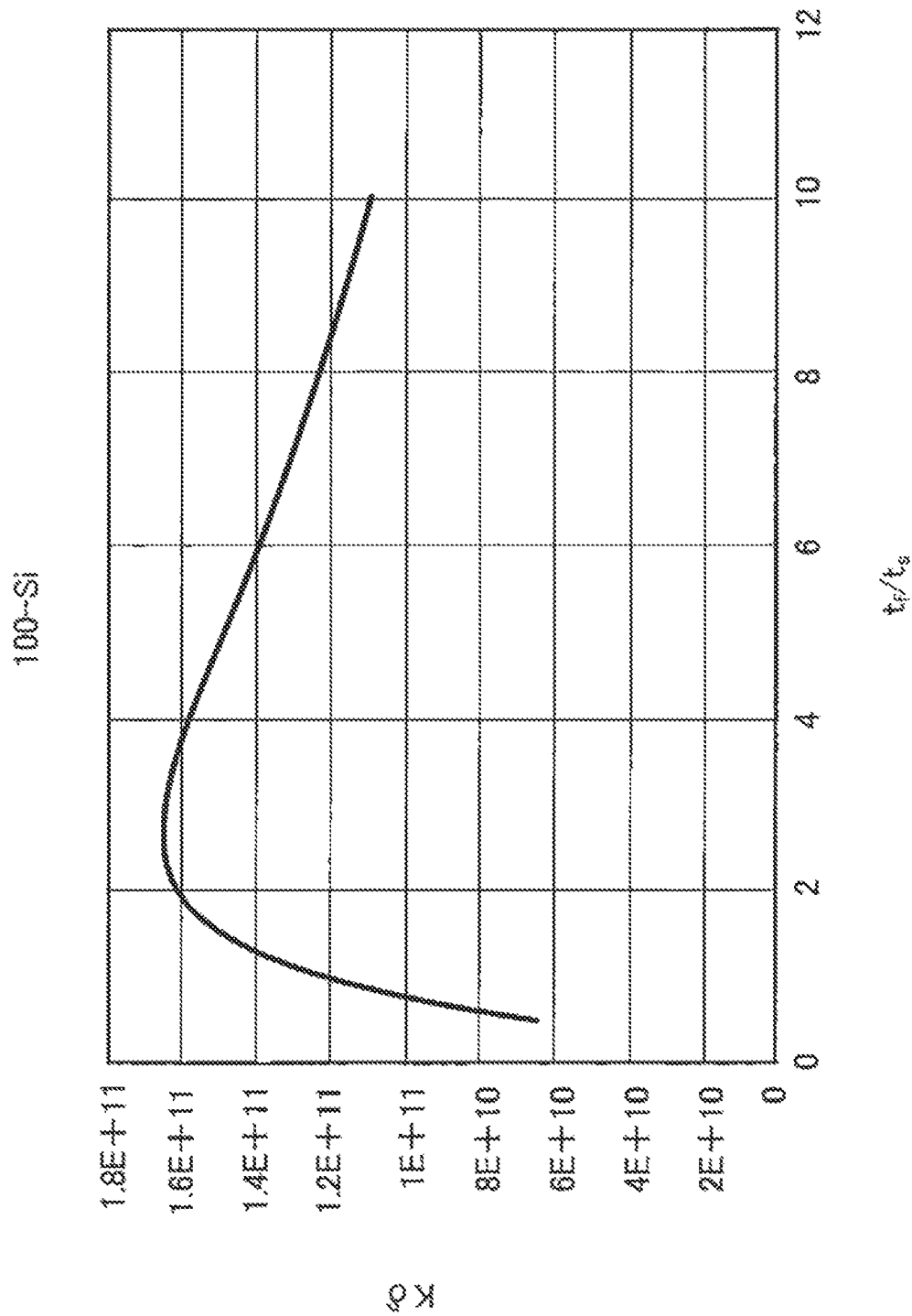
FIG. 7 is a graph illustrating a relationship between a film thicknesses ratio $t_f/t_s$ and $K\delta$.

FIG. 7 is a graph illustrating a relationship between the film thicknesses ratio $t_f/t_s$ and K$\delta$. The graph is a result of a simulation, which is based on Equation 1, Equation 2, and conditions in Table 1, calculating K$\delta$ from the film thickness ratio $t_f/t_s$. A crystal axis of the single crystal silicon contained in the diaphragm 50 is 100.

TABLE 1

| | |
|---|---|
| Bulging length L | 50 μm |
| Piezoelectric constant $d_{31}$ | 100 pm/V |
| Applied voltage V | 20 V |
| Young's modulus $E_f$ of | 65 GPa |

TABLE 1-continued

| | |
|---|---|
| piezoelectric layer 70 | |
| Young's modulus $E_s$ of diaphragm 50 | 130 GPa |
| Film thickness $t_f$ of piezoelectric layer 70 | 1 µm |
| Film thickness $t_s$ of the diaphragm 50 | 1 µm-10 µm |

As illustrated on the graph, the film thickness ratio $t_f/t_s$ and $K\delta$ were in a parabolic relationship that protrudes upwards. $K\delta$ was at its maximum when the ratio $t_f/t_s$ was 2.5. Based on Equation 1, when $K\delta$ is at its maximum, the displacement $\delta$ is also at its maximum; accordingly, the displacement $\delta$ can be maximized by setting the film thickness ratio $t_f/t_s$ to 2.5.

Furthermore, when the ratio $t_f/t_s$ was larger than zero and was smaller than 2.5, $K\delta$ increased in a monotonic manner. Accordingly, as the ratio $t_f/t_s$ approaches 2.5, $K\delta$ increases, and the displacement $\delta$ can be increased.

As expressed in Equation 1, the displacement $\delta$ can also be increased by increasing the bulging length L. However, as described in the Related Art, when the bulging length L of the free end portion 312 is increased, since the size of the pressure chamber 12 increases, the density of the pressure chamber 12 decreases.

However, in the recording head 1 according to the present exemplary embodiment, the displacement $\delta$ can be increased or maximized by, as described above, fixing the bulging length L and setting the film thickness ratio $t_f/t_s$ of the piezoelectric layer 70 to the diaphragm 50 to 2.5 or less. In other words, avoidance of the increase in the size of the pressure chamber 12 due to increase in the bulging length L, and an increase or maximization of the displacement $\delta$ can both be achieved.

Note that as illustrated in FIG. 7, the displacement can be increased even when the film thickness ratio $t_f/t_s$ exceeds 2.5. However, the ratio $t_f/t_s$ becoming large so as to exceed 2.5 means that the film thickness of the piezoelectric layer 70 becomes remarkably large compared with the film thickness of the diaphragm 50. When the film thickness of the piezoelectric layer 70 becomes large in the above manner, the response frequency of the piezoelectric actuator 300 decreases. From the point of view of the response frequency described above, the film thickness ratio $t_f/t_s$ at which the displacement $\delta$ is maximized is, desirably, 2.5 or less. Naturally, while the response frequency is within a practical range, the ratio $t_f/t_s$ may exceed 2.5.

Referring to FIG. 6, a neutral line created in the diaphragm 50 and the piezoelectric layer 70 will be described. As illustrated in FIG. 6, application of a voltage deforms the free end portion 312 upwards (to a side opposite the pressure chamber 12) in the Z direction, and the diaphragm 50 is deformed in a similar manner. In so doing, with a neutral line N in between, tensile stress is generated on the pressure chamber 12 side, and compressive stress is generated on the side opposite the pressure chamber 12. In other words, the neutral line N is a boundary line (a boundary surface) between a portion where the tensile stress of the active portion 310 (the free end portion 312) and the diaphragm 50 has been generated, and a portion where the compressive stress of the active portion 310 (the free end portion 312) and the diaphragm 50 has been generated.

Such a neutral line N is created at different positions depending on the film thicknesses of the diaphragm 50 and the piezoelectric layer 70. The neutral line N, desirably, exists in the diaphragm 50. In other words, as illustrated in FIG. 6, desirably, the neutral line N of the stress exists in a portion of the diaphragm 50 that is between the active portion 310 (the free end portion 312) and the pressure chamber 12.

If the neutral line N does not exist in the diaphragm 50 but exists in the piezoelectric layer 70, tensile stress alone is generated in the diaphragm 50. The diaphragm 50, a representative example thereof being single crystal silicon, becomes cleaved easily and is vulnerable to tensile stress. Accordingly, the diaphragm 50 may be broken.

However, by having the neutral line N exist in the diaphragm 50, there will be compressive stress and tensile stress in the diaphragm 50. The tensile stress in the diaphragm 50 is canceled out or is weakened with the above; accordingly, the concern of the diaphragm 50 becoming broken can be reduced and reliability can be improved. Naturally, such an effect is not limited to the diaphragm 50 in which the representative example thereof is single crystal silicon. In a diaphragm 50 that is formed of a material other than single crystal silicon, the tensile stress is reduced as well; accordingly, the reliability of the diaphragm 50 can be improved.

As described above, in order to have the neutral line N exist in the diaphragm 50, the film thickness ratio $t_f/t_s$ is set smaller than a coefficient $(E_s/E_f)^{1/2}$ based on the Young's modulus $E_s$ of the diaphragm 50 and the Young's modulus $E_f$ of the piezoelectric layer 70. The above coefficient will be described in detail.

As illustrated in FIG. 6, a distance between a surface of the piezoelectric layer 70 and the neutral line N in the Z direction is referred to as $\lambda$. The thicknesses of the first electrode 60 and the second electrode 80 are negligible. Furthermore, a distance between a surface of the diaphragm 50 (a surface on the piezoelectric layer 70 side) and the neutral line N in the Z direction is referred to as D. Given the above, the distance $\lambda$ and the distance D can be obtained with the following equations.

$$\lambda = \{E_f t_f^2 + E_s(t_s^2 + 2t_s t_f)\}/2(E_f t_f + E_s t_s) \quad \text{Equation 3}$$

$$D = \lambda - t_f = \{E_f t_f^2 + E_s t_s(t_s + 2t_f)\}/2(E_f t_f + E_s t_s) - t_f = (E_s t_s^2 - E_f t_f^2)/2(E_f t_f + E_s t_s) \quad \text{Equation 4}$$

According to Equation 3 and Equation 4 described above, when the distance D is positive, the neutral line N exists in the diaphragm 50, and when the distance D is negative, the neutral line N exists in the piezoelectric layer 70. Accordingly, since a condition in which the neutral line N exists in the diaphragm 50 is D>0, the following expression can be obtained.

$$t_f/t_s < (E_s/E_f)^{1/2} \quad \text{Expression 5}$$

Accordingly, by having the film thickness ratio $t_f/t_s$ be larger than zero and smaller than the coefficient $(E_s/E_f)^{1/2}$, the neutral line N can be made to exist in the diaphragm 50, which can prevent the diaphragm 50 from becoming fractured and improve reliability.

Figure 8:
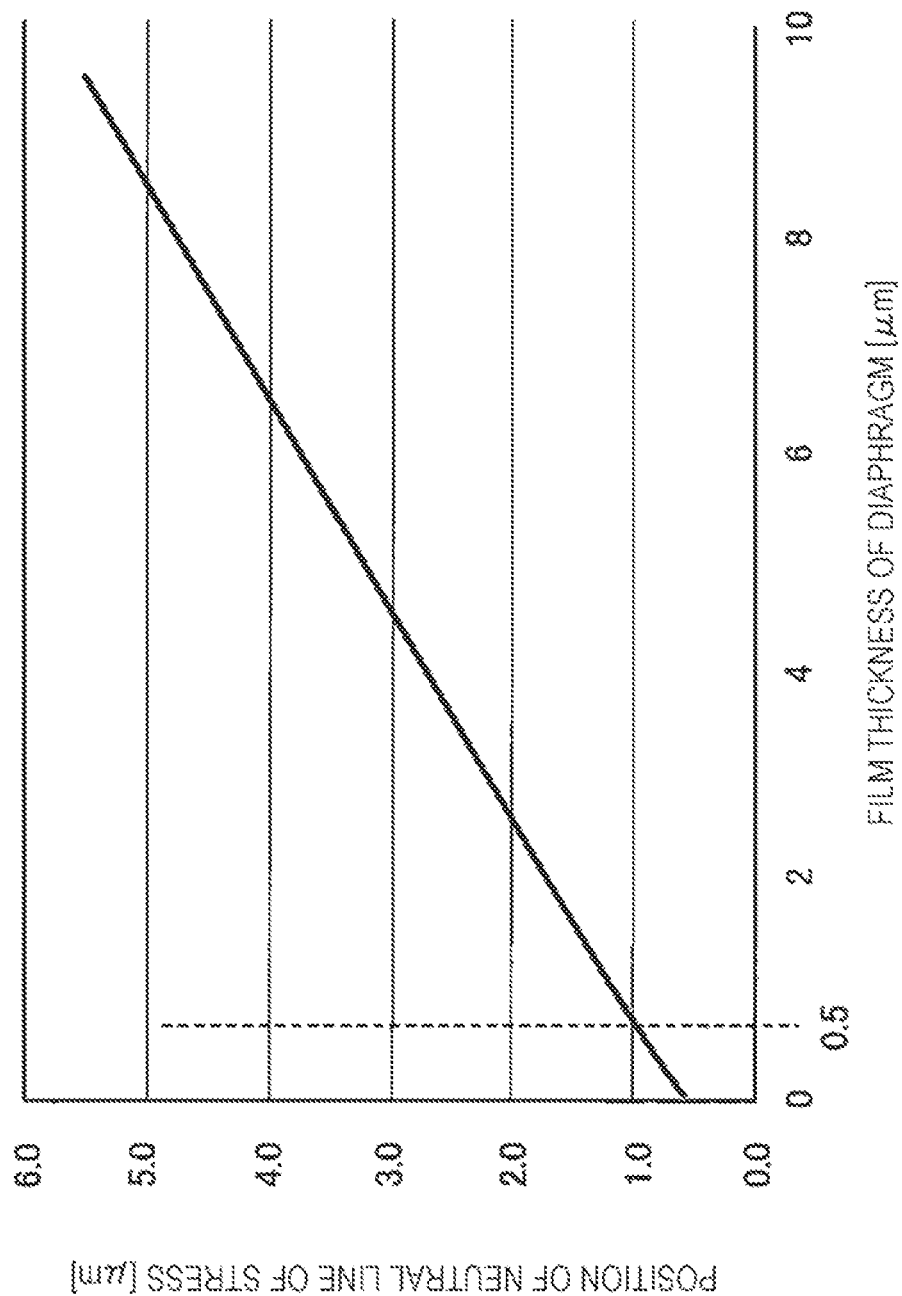
FIG. 8 is a graph illustrating a relationship between a film thickness of a diaphragm and a position of a neutral line.

FIG. 8 is a graph illustrating a relationship between the film thickness of the diaphragm and the position of the neutral line. The axis of abscissa is the film thickness (in units of µm) of the diaphragm 50, and the axis of ordinates is the position of the neutral line N, in other words, is the distance $\lambda$ (in units of µm) illustrated in FIG. 6. The graph is a result of a simulation using conditions illustrated in Table 1 and Equation 3.

As illustrated in the graph, the neutral line N depicts a linear function proportional to the film thickness $t_s$ of the diaphragm 50. In other words, the neutral line N proportional to the film thickness $t_s$ exists at a deep position extending from the surface of the piezoelectric layer 70 towards the pressure chamber 12 side in the Z direction.

As illustrated in Table 1, the film thickness $t_f$ of the piezoelectric layer 70 is 1 μm. Accordingly, a portion where the position of the neutral line N exceeds 1 μm indicates that the neutral line N is inside the diaphragm 50. The range of the film thickness $t_s$ of the diaphragm 50 in which the position of the neutral line N exceeds 1 μm is 0.5 μm or more.

Since the film thickness $t_s$ of the diaphragm 50 is 0.5 μm and the film thickness $t_f$ of the piezoelectric layer 70 is 1 μm, the film thickness ratio $t_f/t_s$ is 2.0. Accordingly, it can be conceived that when the film thickness ratio $t_f/t_s$ is 2.0 or less, the neutral line N exists in the diaphragm 50. As described above, by having the film thickness ratio $t_f/t_s$ be 2.0 or less, the neutral line N can be made to exist in the diaphragm 50. As a result, fracturing of the diaphragm 50 due to concentration of stress is prevented and the reliability of the diaphragm 50 is improved.

In the recording head 1 described above, the representative example of the diaphragm 50 is single crystal silicon. A case in which another material is used will be described. FIGS. 9 to 13 are graphs that illustrate the relationships between the film thicknesses ratio $t_f/t_s$ and Kδ. Each graphs in FIGS. 9 to 13 are, similar to FIG. 7, results of simulations conducted with diaphragms 50, in which the representative examples of the materials of the diaphragm 50 being those illustrated in Table 2. Regarding the Young's moduli, those illustrated in FIG. 2 were used. Other conditions are similar to those in Table 1.

TABLE 2

| FIG. Number | Material of Diaphragm 50 | Young's modulus (Pa) |
| --- | --- | --- |
| 9 | Silicon nitride (Si$_3$N$_4$) | 3.00 × 10$^{11}$ |
| 10 | Silicon carbide (SiC) | 4.40 × 10$^{11}$ |
| 11 | Aluminum oxide (Al$_2$O$_3$) | 3.80 × 10$^{11}$ |
| 12 | Zirconium oxide (ZrO$_2$) | 2.20 × 10$^{11}$ |
| 13 | Aluminum nitride (AlN) | 3.20 × 10$^{11}$ |

In each of FIGS. 9 to 13, the film thickness ratio $t_f/t_s$ and the coefficient Kδ are in a parabolic relationship that protrudes upwards.

Figure 9:
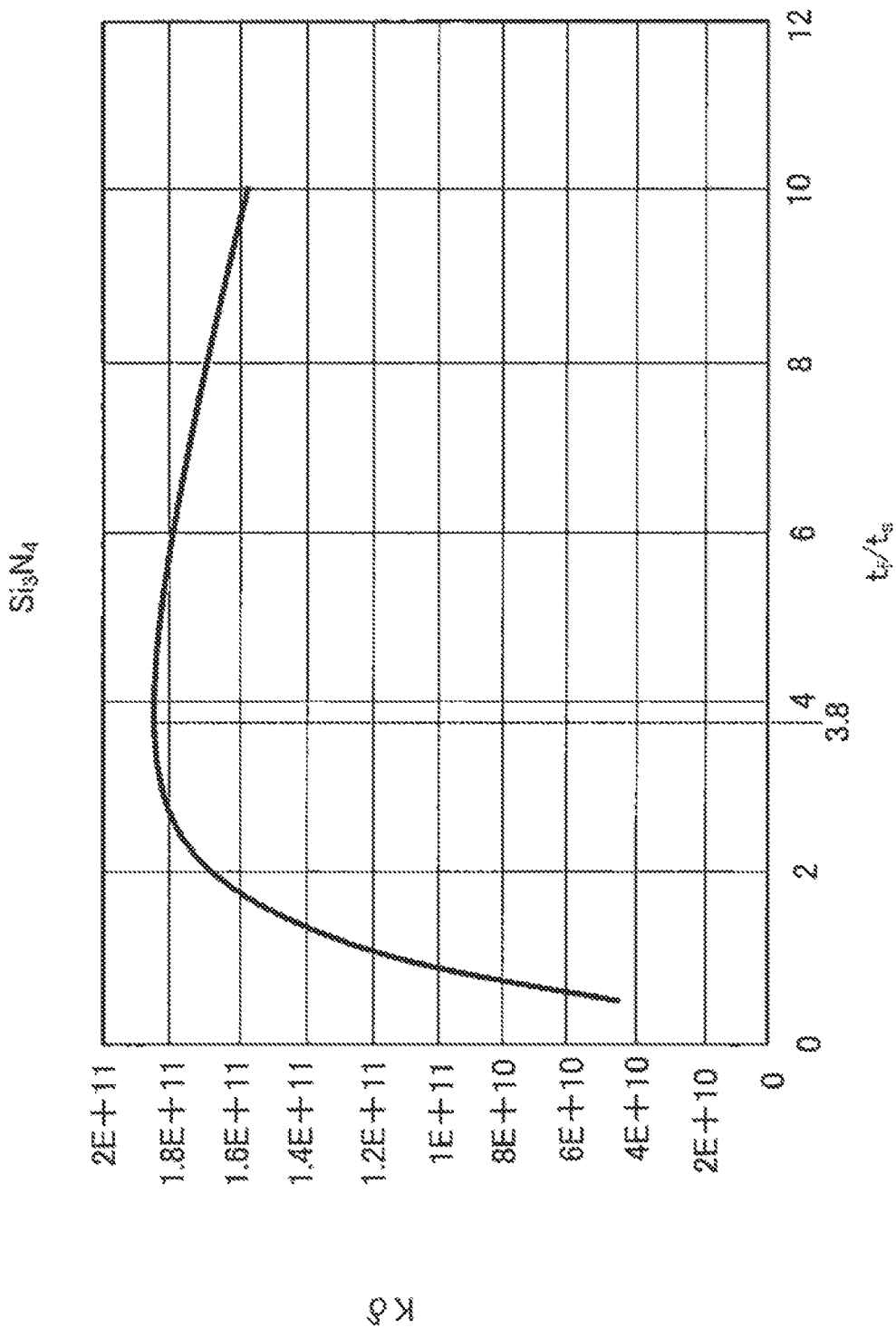
FIG. 9 is a graph illustrating a relationship between the film thicknesses ratio $t_f/t_s$ and $K\delta$.

As illustrated in FIG. 9, when the representative example of the diaphragm 50 was silicon nitride, the coefficient Kδ was at its maximum value when the film thickness ratio $t_f/t_s$ was 3.8.

Figure 10:
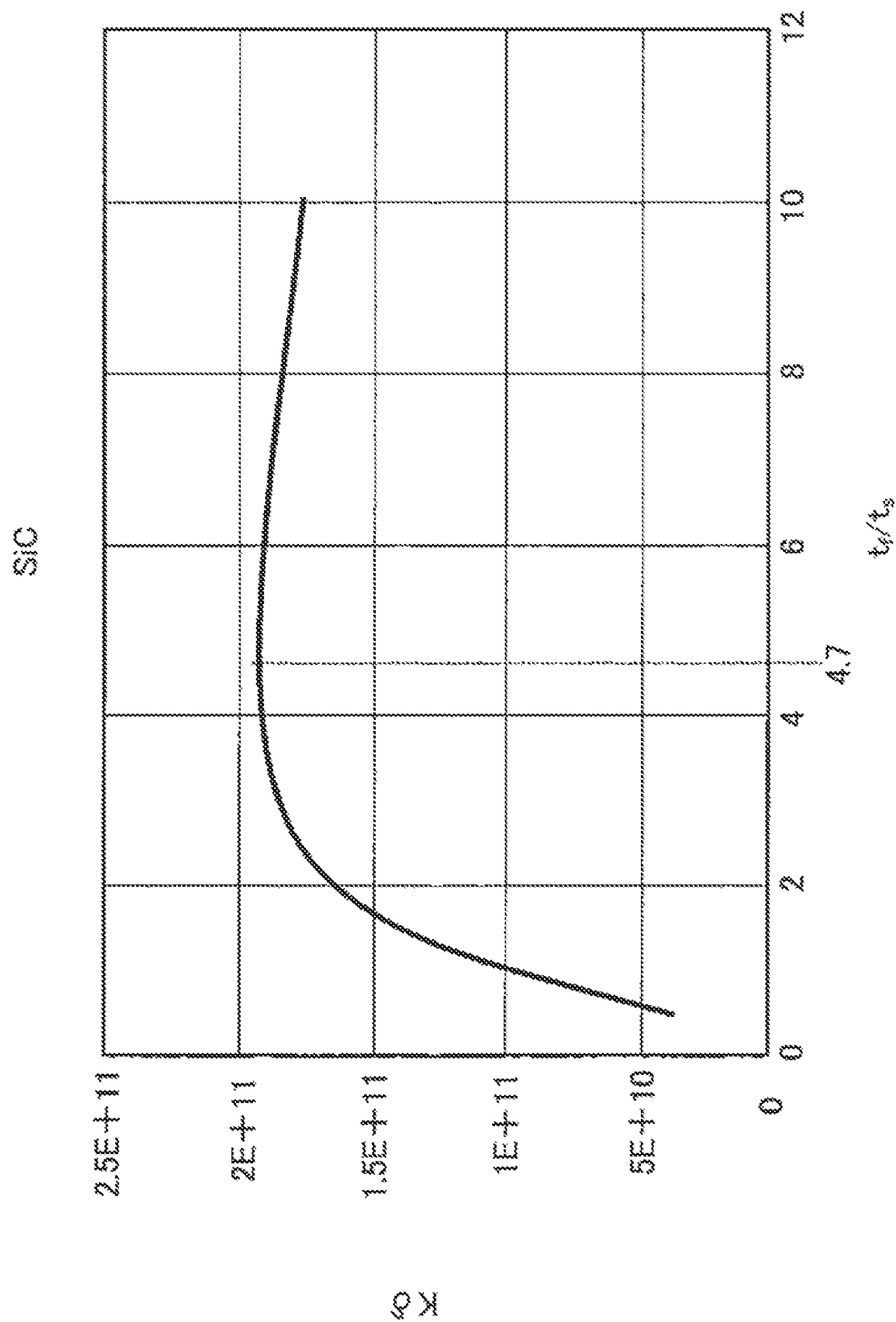
FIG. 10 is a graph illustrating a relationship between the film thicknesses ratio $t_f/t_s$ and $K\delta$.

As illustrated in FIG. 10, when the representative example of the diaphragm 50 was silicon carbide, the coefficient Kδ was at its maximum value when the film thickness ratio $t_f/t_s$ was 4.7.

Figure 11:
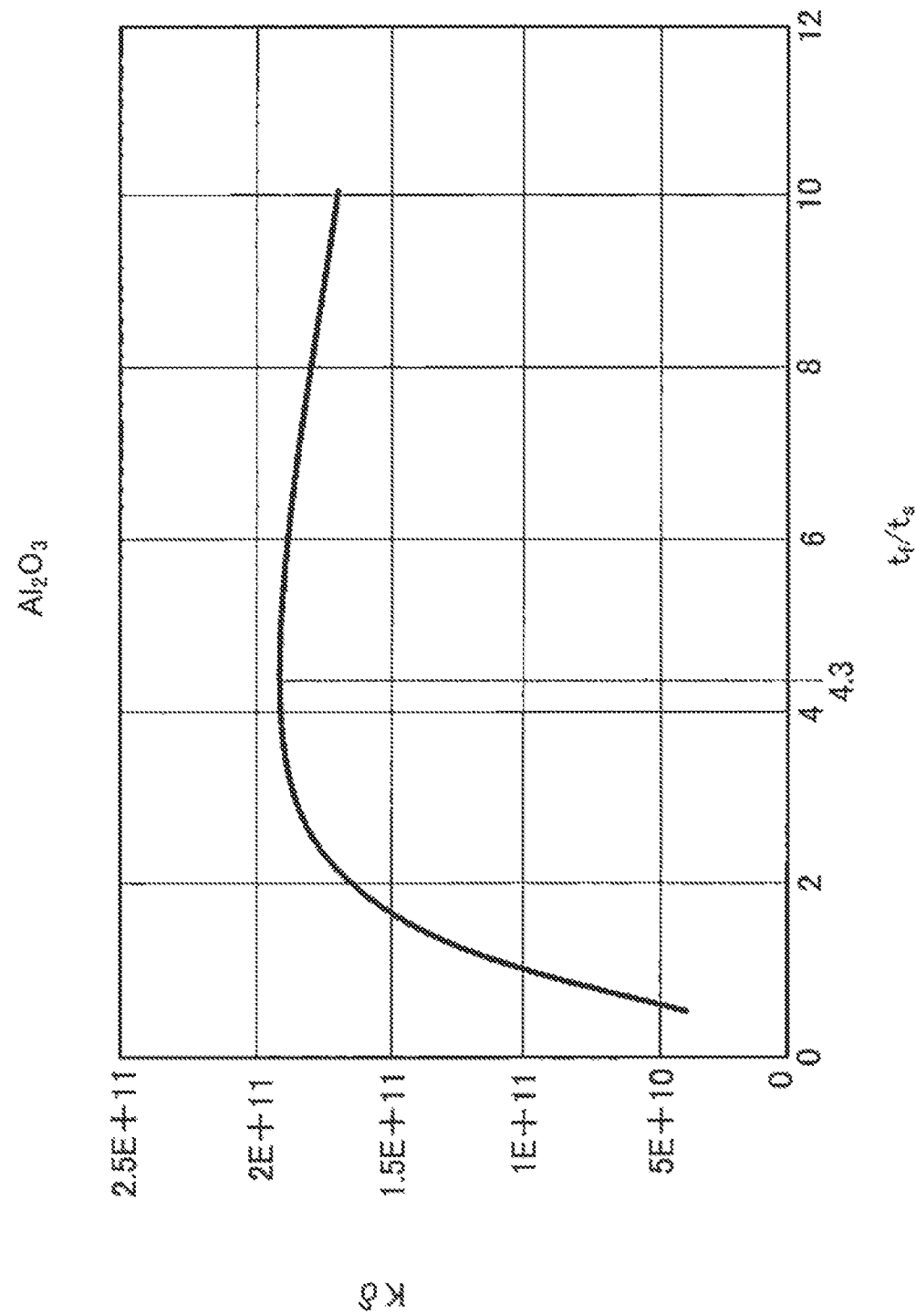
FIG. 11 is a graph illustrating a relationship between the film thicknesses ratio $t_f/t_s$ and $K\delta$.

As illustrated in FIG. 11, when the representative example of the diaphragm 50 was aluminum oxide, the coefficient Kδ was at its maximum value when the film thickness ratio $t_f/t_s$ was 4.3.

Figure 12:
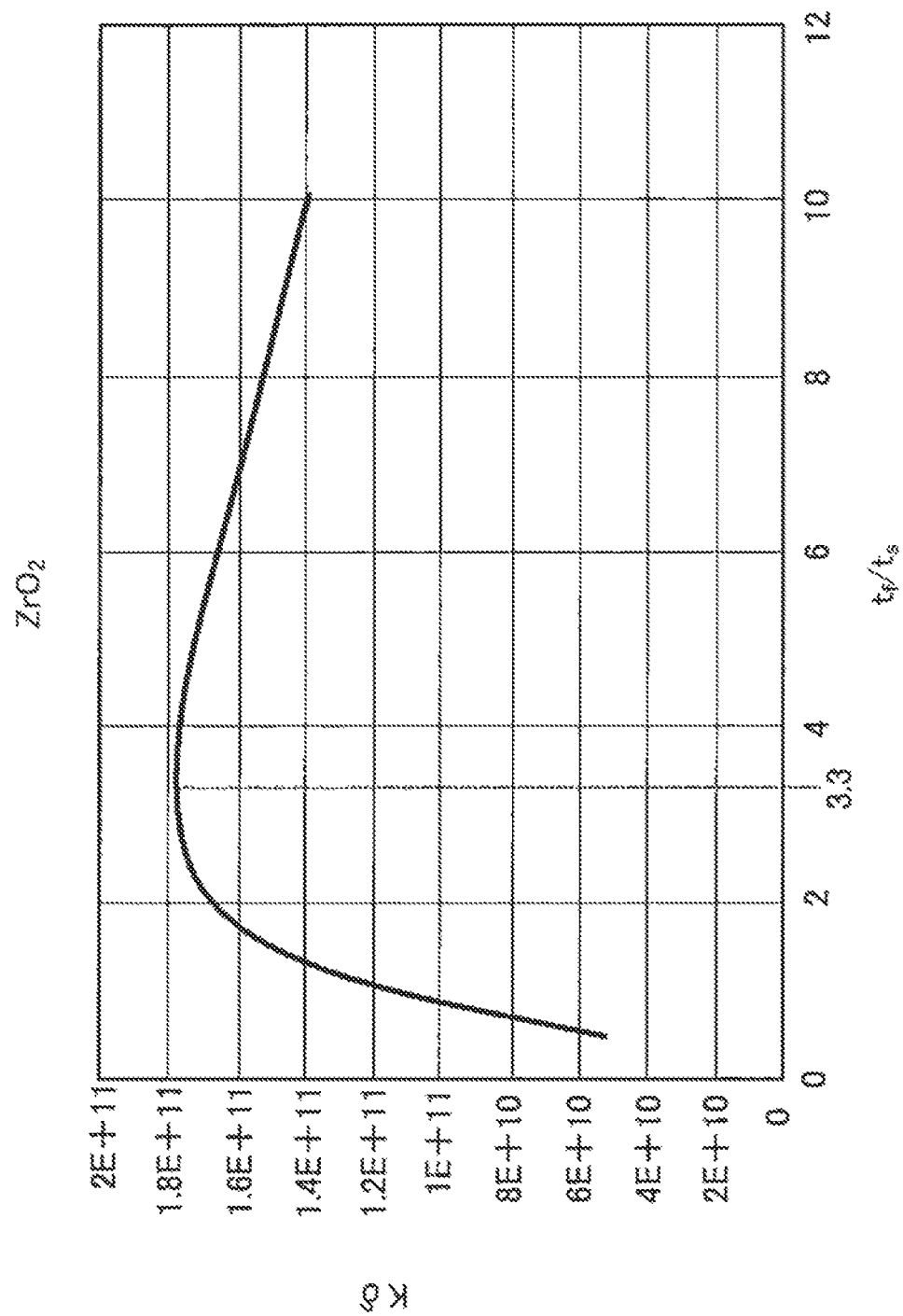
FIG. 12 is a graph illustrating a relationship between the film thicknesses ratio $t_f/t_s$ and $K\delta$.

As illustrated in FIG. 12, when the representative example of the diaphragm 50 was zirconium oxide, the coefficient Kδ was at its maximum value when the film thickness ratio $t_f/t_s$ was 3.3.

Figure 13:
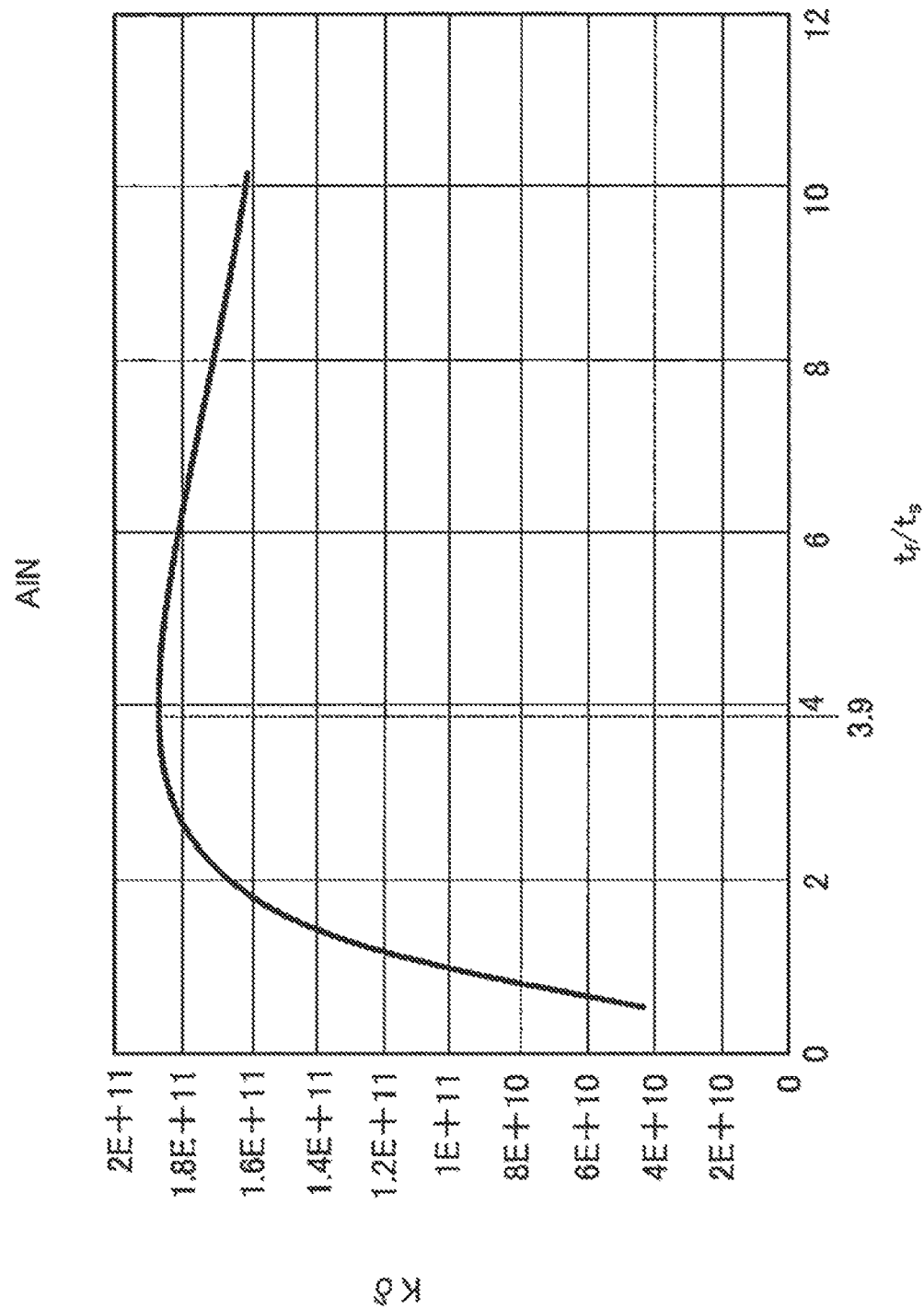
FIG. 13 is a graph illustrating a relationship between the film thicknesses ratio $t_f/t_s$ and $K\delta$.

As illustrated in FIG. 13, when the representative example of the diaphragm 50 was aluminum nitride, the coefficient Kδ was at its maximum value when the film thickness ratio $t_f/t_s$ was 3.9.

As described above, as a result of conducting simulations while changing the material of the diaphragm 50 with those that are typically used as the material of the diaphragm 50, one can understand that the coefficient Kδ that maximizes the displacement δ is obtained when the film thickness ratio $t_f/t_s$ is within the range of 4.7 or less. Accordingly, by setting the film thickness ratio $t_f/t_s$ to 4.7 or less, an increase in the size of the pressure chamber 12 can be suppressed and the displacement δ can be maximized or increased.

As described above, in the recording head 1, desirably, the film thickness ratio $t_f/t_s$ is smaller than $(E_s/E_f)^{1/2}$. The above is on the premise that the representative example of the diaphragm 50 is single crystal silicon, and the Young's modulus $E_s$ of the diaphragm 50 is the Young's modulus of the single crystal silicon. However, when the representative example of the diaphragm 50 is not single crystal silicon, in other words, when the diaphragm 50 is constituted by a plurality of layers of various materials, the Young's modulus (synthetic Young's modulus) $E_s$ can be obtained by Equation 6 and Equation 7.

$$E_s = (4/h^3)\Sigma E_i\{(h_i-\lambda')^3-(h_{i-1}-\lambda')^3\}$$ Equation 6

$$\lambda'=\Sigma E_i(h_i^2-h_{i-1}^2)/2\Sigma E_i t_i$$ Equation 7 h: film thickness of the diaphragm 50
$E_i$: Young's modulus of the i$^{th}$ material constituting the diaphragm 50
$h_i$: distance between the surface of the diaphragm 50 to a surface of the i$^{th}$ material
$t_i$: film thickness of the i$^{th}$ material
$\lambda'$: distance between the surface of the diaphragm 50 and the neutral line FIG. 14 is a cross-sectional view of the diaphragm 50 formed of a plurality of layers. As illustrated in FIG. 14, the diaphragm 50 is formed of three layers, namely, a first layer that is the first one, a second layer which is the second one, and a third layer which is the third one that are layered in that order from the surface of the diaphragm 50, which is the surface on the side opposite the pressure chamber 12.

In the diaphragm 50 configured in the above manner, a Young's modulus of the first layer is $E_1$, a Young's modulus of the second layer is $E_2$, and a Young's modulus of the third layer is $E_3$. Furthermore, a distance between the surface of the diaphragm 50 and the surface of the first layer is $h_1$ (zero in FIG. 14). Similarly, a distance to the surface of the second layer is $h_2$, and a distance to the surface of the third layer is $h_3$.

By setting each Young's modulus $E_i$ and each distance $h_i$ of the first to third layers, the synthetic Young's modulus $E_s$ of the diaphragm 50 based on Equation 6 and Equation 7 can be obtained. In other words, even in a configuration in which the diaphragm 50 is configured of a plurality of layers, by having the film thickness ratio $t_f/t_s$ be smaller than $(E_s/E_f)^{1/2}$, fracturing of the diaphragm 50 due to concentration of stress can be prevented and reliability can be improved.

Figure 15:
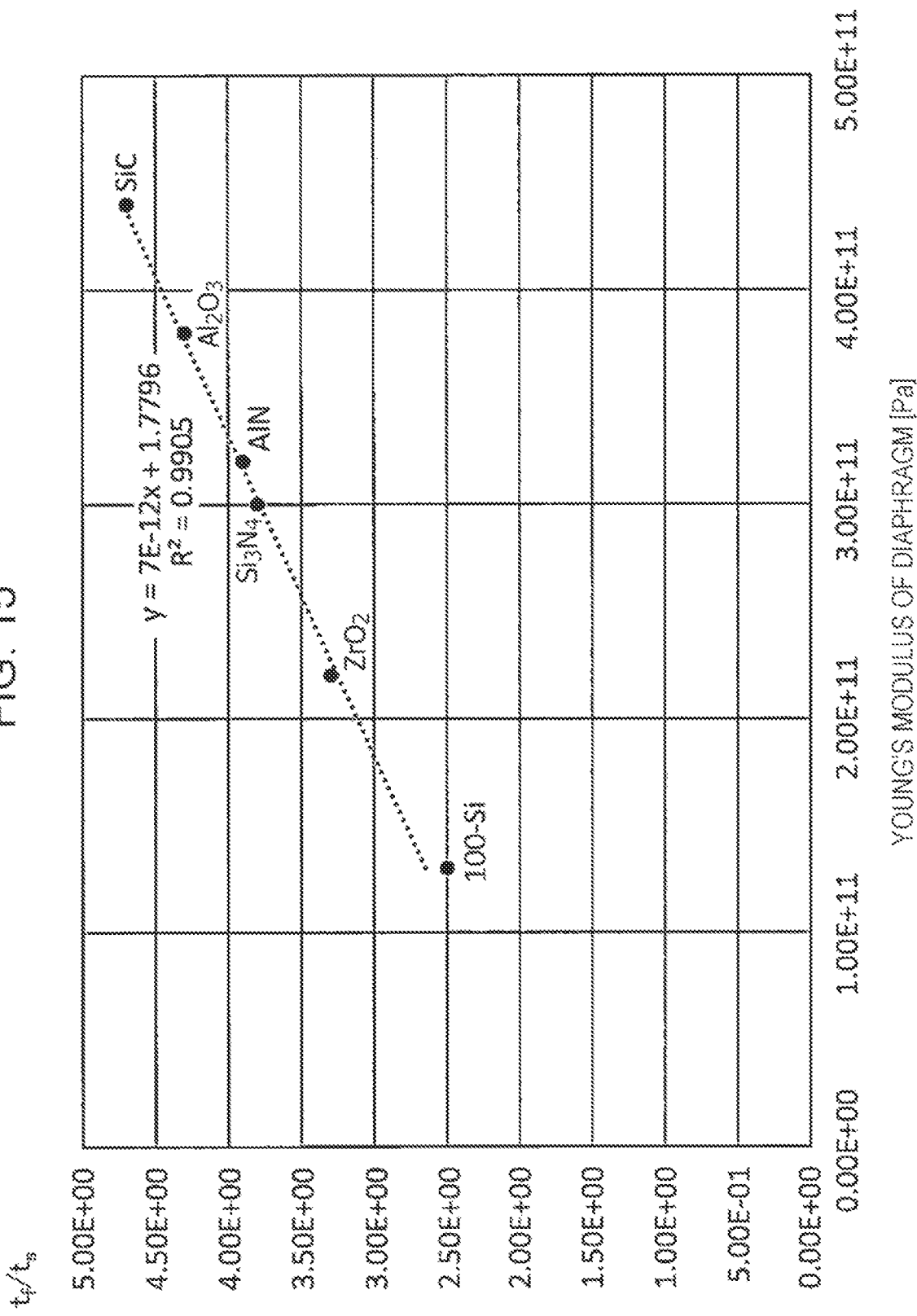
FIG. 15 is a graph illustrating a Young's modulus of the diaphragm and a film thickness ratio that maximizes $K\delta$.

FIG. 15 is a diagram illustrating a relationship between the Young's modulus of the diaphragm 50, and the film thickness ratio $t_f/t_s$ that maximizes Kδ. In FIG. 15, the Young's moduli of the representative materials of the diaphragms 50 illustrated in FIGS. 7 and 9 to 13, and the film thickness ratios $t_f/t_s$ that maximize Kδ are plotted. When the Young's moduli as a variable X and the film thickness ratios $t_f/t_s$ as a variable Y are approximated with a linear function, the following equation 8 is obtained.

$$Y = 7 \times 10^{-12} X + 1.7796 \qquad \text{Equation 8}$$

According to the above approximation, when the Young's modulus (the synthetic Young's modulus of the diaphragm 50 when configured as in FIG. 14) of the diaphragm 50 is determined, the film thickness ratio $t_f/t_s$ that maximizes the coefficient Kδ can be obtained. Accordingly, when the ratio of the film thickness obtained by the approximation described above is Y, the ratio of the film thickness $t_f/t_s$ is, preferably, Y or less. With the above, the displacement δ of the free end portion 312 can be maximized or increased.

Note that the pressure chamber 12 corresponds to a recessed portion in the claims, and the flow path forming substrate 10 corresponds to a substrate in the claims. In the exemplary embodiment described above, a device including the flow path forming substrate 10 in which the pressure chambers 12 are formed, the diaphragm 50, and the piezoelectric actuators 300 is referred to as a piezoelectric device. In other words, the recording head 1 includes the piezoelectric device.

As described above, the piezoelectric device of the present exemplary embodiment includes the flow path forming substrate 10, which is an example of the substrate, in which the pressure chambers 12, which is an example of the recessed portions, are formed, the diaphragm 50, and the piezoelectric actuators 300. The piezoelectric actuators 300 include annular-shaped active portions 310. The active portion 310 has a so-called cantilever structure that includes the free end portion 312. In such an active portion 310, the ratio $t_f/t_s$ of the film thickness $t_f$ of the piezoelectric layer 70 to the film thickness $t_s$ of the diaphragm 50 is 4.7 or less.

As described above, by setting the film thickness ratio $t_f/t_s$ to 4.7 or less, avoidance of an increase in the size of the pressure chamber 12 due to an increase in the bulging length L, and an increase or maximization of the displacement δ can both be achieved.

Furthermore, in the piezoelectric device of the present exemplary embodiment, the film thickness ratio $t_f/t_s$ is preferably 2.5 or less. With the above, even in a diaphragm 50 using a material that easily becomes broken such as, single crystal silicon, in particular, avoidance of an increase in the size of the pressure chamber 12, and an increase or maximization of the displacement δ can both be achieved.

Furthermore, in the piezoelectric device of the present exemplary embodiment, the film thickness ratio $t_f/t_s$ is, desirably, smaller than $(E_s/E_f)^{1/2}$. With the above, the neutral line of the stress can exist in the diaphragm 50; accordingly, damage due to concentration of stress in the diaphragm 50 can be prevented, and the reliability of the diaphragm 50 can be improved.

Furthermore, in the piezoelectric device of the present exemplary embodiment, the diaphragm 50, desirably, contains single crystal silicon. With the above, even in a configuration using the diaphragm 50 containing single crystal silicon that is easily damaged by concentration of stress, the concentration of stress can be alleviated and the damage can be prevented.

Furthermore, in the piezoelectric device of the present exemplary embodiment, desirably, there is compressive stress in the single crystal silicon of the diaphragm 50. The single crystal silicon of the diaphragm 50 having compressive stress denotes a state in which there is compressive stress alone or there is a mixture of compressive stress and tensile stress. In the latter case, as illustrated in FIG. 6, the neutral line N exists in the film formed of single crystal silicon in the diaphragm 50. With the above, even with a configuration using the diaphragm 50 containing single crystal silicon that is easily damaged by tensile stress, the concentration of stress is alleviated and damage thereto can be prevented.

Furthermore, as illustrated in FIG. 6, in the piezoelectric device of the present exemplary embodiment, desirably, the neutral line N of the stress exists in the diaphragm 50. With the above, the stress applied to the diaphragm 50 is alleviated; accordingly, damage in the diaphragm 50 can be prevented.

Furthermore, in the piezoelectric device of the present exemplary embodiment, the film thickness ratio $t_f/t_s$ is, preferably, 2.0 or less. With the above, the neutral line N can be made to exist in the diaphragm 50 in a more reliable manner. As a result, fracturing of the diaphragm 50 due to concentration of stress is prevented, and the reliability of the diaphragm 50 is improved.

Furthermore, the recording head 1, which is the liquid ejecting head of the present exemplary embodiment, includes the piezoelectric device described above. The recording head 1 including the piezoelectric device of the present exemplary embodiment can suppress an increase in the size of the pressure chambers 12 and can improve the displacement δ of the diaphragm 50.

Other Exemplary Embodiments

The exemplary embodiments of the present disclosure have been described above; however, the basic configuration of the present disclosure is not limited to those described above.

An example of an ink jet recording apparatus that is an example of the liquid ejecting apparatus of the present exemplary embodiment will be described with reference to FIG. 16. FIG. 16 is a diagram illustrating a schematic configuration of the ink jet recording apparatus of the present exemplary embodiment.

In an ink jet recording apparatus I, which is an example of the liquid ejecting apparatus, a plurality of recording heads 1 are mounted on a carriage 3. The carriage 3 on which the recording heads 1 are mounted is provided so as to be movable in an axial direction along a carriage shaft 5 attached to an apparatus body 4. In the present exemplary embodiment, a moving direction of the carriage 3 is the Y direction, which is a first axial direction.

Furthermore, a tank 2 that is a storage member in which ink serving as a liquid is stored is provided in the apparatus body 4. The tank 2 is coupled to the recording heads 1 through a supply pipe 2a such as a tube. The ink from the tank 2 is supplied to the recording heads 1 through the supply pipe 2a. Note that the tank 2 may be configured in a plural number.

Furthermore, the carriage 3 on which the recording heads 1 are mounted is moved along the carriage shaft 5 by having driving force of a drive motor 7 transmitted to the carriage 3 through a plurality of gears (not shown) and a timing belt 7a. A transport roller 8 serving as a transport member is provided in the apparatus body 4. A recording sheet S serving as an liquid ejected medium such as paper is transported by the transport roller 8. Note that the transport member that transports the recording sheet S is not limited to the transport roller 8 and may be a belt, a drum, or the like. In the present exemplary embodiment, a transport direction of the recording sheet S is the X direction.

Note that in the ink jet recording apparatus I described above, an ink jet recording apparatus in which the recording heads 1 mounted on the carriage 3 move in a main scanning direction has been illustrated as an example; however, not limited to the above, the present disclosure can be applied to, for example, a so-called line recording apparatus in which printing is performed by simply moving the recording sheet S, such as paper, in a sub scanning direction while the recording heads 1 is fixed.

Furthermore, the exemplary embodiments have been described with the ink jet recording head, as an example of the liquid ejecting head, and the ink jet recording apparatus, as an example of the liquid ejecting apparatus. However, the present disclosure is subject widely to liquid ejecting heads and liquid ejecting apparatuses in general and, naturally, can be applied to liquid ejecting heads and liquid ejecting apparatuses that eject a liquid other than ink. Other liquid ejecting heads include, for example, various recording heads used in an image recording apparatus such as a printer, a coloring material ejecting head used to manufacture a color filter of a liquid crystal display and the like, an electrode material ejecting head used to form electrodes of an organic EL display, a field emission display (FED), and the like, and a bioorganic matter ejecting head used to manufacture biochips. The present disclosure can be applied to a liquid ejecting apparatus including one of the liquid ejecting heads described above.

Furthermore, the present disclosure is not limited to a liquid ejecting head and may be used in other piezoelectric devices including the piezoelectric actuator 300. Other piezoelectric devices include, for example, an ultrasonic device such as an ultrasonic transmitter; an ultrasonic motor; a thermoelectric transducer; a pressure transducer; a ferroelectric transistor; a piezoelectric transformer; filters such as a filter shielding harmful rays such as infrared rays, an optical filter that uses photonic crystal effect by quantum dot formation, and an optical filter that uses optical interference of a thin film; various sensors such as an infrared sensor, an ultrasonic sensor, a thermal sensor, a pressure sensor, a pyroelectric sensor, and a gyro sensor (an angular velocity sensor); and a ferroelectric memory.

What is claimed is:

1. A piezoelectric device comprising:
a substrate in which a plurality of recessed portions are formed;
a diaphragm formed on a surface of the substrate on one side; and
a piezoelectric actuator formed on a surface of the diaphragm on a side opposite the substrate, the piezoelectric actuator including a first electrode, a piezoelectric layer, and a second electrode,
wherein the piezoelectric actuator includes an active portion in which the piezoelectric layer is interposed between the first electrode and the second electrode,
in a plan view viewed in a direction in which the first electrode, the piezoelectric layer, and the second electrode are layered, the active portion is provided from an edge portion to a portion outside a recessed portion of the plurality of recessed portions, the edge portion being, in an area that opposes the recessed portion, an area other than a middle portion, the middle portion being defined by a section of the diaphragm that overlaps the recessed portion and is not covered by any of the first electrode, the piezoelectric layer and the second electrode,
in the plan view, the recessed portions in an arrangement direction in which the plurality of recessed portions are arranged have the active portions at the edge portions on both sides of the portion opposite the recessed portions, and the recessed portions in the arrangement direction in which the plurality of recessed portions are arranged have no active portion at the middle portions on both sides of the portion opposite to the recessed portions, and
in an area where the active portion and the diaphragm overlap each other in plan view, a ratio $t_f/t_s$ of a film thickness $t_f$ of the piezoelectric layer to a film thickness $t_s$ of the diaphragm is 4.7 or less, and
the ratio $t_f/t_s$ is smaller than $(E_s/E_f)^{1/2}$, where $E_f$ is a Young's modulus of the piezoelectric layer and $E_s$ is a Young's of the diaphragm.

2. The piezoelectric device according to claim 1, wherein the ratio $t_f/t_s$ is 2.5 or less.

3. The piezoelectric device according to claim 1, wherein the ratio $t_f/t_s$ is larger than zero.

4. The piezoelectric device according to claim 1, wherein the diaphragm contains single crystal silicon.

5. The piezoelectric device according to claim 4, wherein the single crystal silicon in the diaphragm has compressive stress.

6. The piezoelectric device according to claim 1, wherein a neutral line of stress exists in a portion of the diaphragm interposed between the active portion and the recessed portion.

7. The piezoelectric device according to claim 1, wherein the ratio $t_f/t_s$ is 2.0 or less.

8. A liquid ejecting head comprising the piezoelectric device according to claim 1.

9. A liquid ejecting apparatus comprising the liquid ejecting head according to claim 8.

* * * * *